(12) United States Patent
Kurihara et al.

(10) Patent No.: US 9,704,643 B2
(45) Date of Patent: Jul. 11, 2017

(54) CONTACTLESS POWER TRANSMISSION DEVICE, AND POWER FEEDER AND POWER RECEIVER FOR USE IN THE SAME

(71) Applicant: PANASONIC CORPORATION, Osaka (JP)

(72) Inventors: Hiroaki Kurihara, Shiga (JP); Yoshihiro Sakamoto, Nara (JP); Atsushi Fujita, Shiga (JP)

(73) Assignee: PANASONIC INTELLECTUAL PROPERTY MANAGEMENT CO., LTD, Osaka (JP)

(*) Notice: Subject to any disclaimer, the term of this patent is extended or adjusted under 35 U.S.C. 154(b) by 364 days.

(21) Appl. No.: 14/199,283

(22) Filed: Mar. 6, 2014

(65) Prior Publication Data

US 2014/0183970 A1 Jul. 3, 2014

Related U.S. Application Data

(63) Continuation of application No. PCT/JP2012/006931, filed on Oct. 29, 2012.

(30) Foreign Application Priority Data

Oct. 28, 2011 (JP) .................................. 2011-236896

(51) Int. Cl.
*H02J 7/02* (2016.01)
*H02J 5/00* (2016.01)
(Continued)

(52) U.S. Cl.
CPC ............ *H01F 38/14* (2013.01); *B60L 11/182* (2013.01); *B60L 11/1824* (2013.01);
(Continued)

(58) Field of Classification Search
CPC ...... B60L 11/182; B60L 11/1824; H02J 50/60; H02J 5/005; H02J 7/025; H02J 17/00;
(Continued)

(56) References Cited

U.S. PATENT DOCUMENTS 8,946,938 B2 * 2/2015 Kesler ................... B60L 11/182
307/10.1
9,154,189 B2 * 10/2015 Von Novak ............. H02J 5/005
(Continued)

FOREIGN PATENT DOCUMENTS

JP 3-244109 A 10/1991
JP 7-016553 U 3/1995
(Continued)

OTHER PUBLICATIONS

Extended European Search Report issued in Application No. 12844077.3 dated Apr. 24, 2015.
(Continued)

*Primary Examiner* — Ryan Johnson
(74) *Attorney, Agent, or Firm* — McDermott, Will and Emery LLP

(57) ABSTRACT

A power feeder of a contactless power transmission device includes a housing base member, a primary coil provided on the housing base member and configured to generate magnetic flux, a cover attached to the housing base member and configured to cover the primary coil, a capacitance sensor including a detection electrode between the primary coil and the cover, and configured to detect foreign matter around the cover based on a change in capacitance detected using the detection electrode, and a high-dielectric member embedded in the cover and having a permittivity higher than that of a material for the cover.

11 Claims, 12 Drawing Sheets

(51) Int. Cl.
*B60L 11/18* (2006.01)
*H01F 38/14* (2006.01)
*H02J 50/60* (2016.01)
*H02J 50/12* (2016.01)
*G01R 27/26* (2006.01)
*H04B 5/00* (2006.01)

(52) U.S. Cl.
CPC ....... *B60L 11/1833* (2013.01); *B60L 11/1846* (2013.01); *G01R 27/2605* (2013.01); *H02J 5/005* (2013.01); *H02J 50/12* (2016.02); *H02J 50/60* (2016.02); *B60L 2200/26* (2013.01); *B60L 2210/30* (2013.01); *B60L 2210/40* (2013.01); *B60L 2230/16* (2013.01); *B60L 2240/36* (2013.01); *B60L 2250/10* (2013.01); *B60L 2250/16* (2013.01); *B60L 2270/147* (2013.01); *H02J 7/025* (2013.01); *H04B 5/0031* (2013.01); *H04B 5/0037* (2013.01); *H04B 5/0081* (2013.01); *Y02T 10/7005* (2013.01); *Y02T 10/7088* (2013.01); *Y02T 10/7241* (2013.01); *Y02T 90/121* (2013.01); *Y02T 90/122* (2013.01); *Y02T 90/125* (2013.01); *Y02T 90/127* (2013.01); *Y02T 90/128* (2013.01); *Y02T 90/14* (2013.01); *Y02T 90/163* (2013.01); *Y02T 90/169* (2013.01); *Y04S 30/14* (2013.01)

(58) Field of Classification Search
CPC ........... H02J 50/10; H02J 50/12; H01F 38/14; H04B 5/0037; Y02T 10/7088; Y02T 90/122

See application file for complete search history.

(56) References Cited

U.S. PATENT DOCUMENTS

| | | |
|---|---|---|
| 2006/0273806 A1 | 12/2006 | Kirchner et al. |
| 2010/0084918 A1 | 4/2010 | Fells et al. |
| 2010/0109604 A1 | 5/2010 | Boys et al. |
| 2010/0271048 A1 | 10/2010 | Kouno |
| 2013/0029595 A1* | 1/2013 | Widmer ............... H04B 5/0031 455/39 |
| 2015/0288214 A1* | 10/2015 | Borngraber ............ G01D 5/24 382/103 |

FOREIGN PATENT DOCUMENTS

| | | |
|---|---|---|
| JP | 2003-170601 A | 6/2003 |
| JP | 2007-528964 A | 10/2007 |
| JP | 2008-087733 A | 4/2008 |
| JP | 2010-257181 A | 11/2010 |
| JP | 2011-010435 A | 1/2011 |
| WO | 2008/140333 A2 | 11/2008 |

OTHER PUBLICATIONS

International Search Report issued in International Application No. PCT/JP2012/006931 mailed Feb. 5, 2013, with English translation, 5 pgs.

* cited by examiner

CONTACTLESS POWER TRANSMISSION DEVICE, AND POWER FEEDER AND POWER RECEIVER FOR USE IN THE SAME

CROSS-REFERENCE TO RELATED APPLICATIONS

This is a continuation of International Application No. PCT/JP2012/006931 filed on Oct. 29, 2012, which claims priority to Japanese Patent Application No. 2011-236896 filed on Oct. 28, 2011. The entire disclosures of these applications are incorporated by reference herein.

BACKGROUND

FIG. 14 is a diagram showing a configuration of a contactless power transmission device and surrounding devices described in Japanese Unexamined Patent Publication No. 2008-87733. In FIG. 14, the contactless power transmission device 1 includes a power feeder (primary device) F which is provided on the ground and is connected to the power source board of a power source 4, and a power receiver (secondary device) G which is mounted in an electric vehicle or a train. During power feed, the power feeder F and the power receiver G are positioned to face each other, without physical contact therebetween, i.e., with an air gap (empty space) being interposed therebetween.

In such an arrangement, when an alternating current is applied to a primary coil 2 included in the power feeder F to generate magnetic flux, electromotive force is induced in a secondary coil 3 included in the power receiver G, whereby power is contactlessly transmitted from the primary coil 2 to the secondary coil 3.

The power receiver G is connected to, for example, an in-vehicle battery 5, which is charged with the power transmitted from the power feeder F to the power receiver G. An in-vehicle motor 6 is driven by the power accumulated in the in-vehicle battery 5. Note that, during the contactless power feed process, necessary information is exchanged between the power feeder F and the power receiver G by a wireless communication device 7.

FIGS. 15A and 15B are cross-sectional views of the power feeder F (the power receiver G) of FIG. 14. FIG. 15A is a cross-sectional view of the power feeder F (the power receiver G) taken along a horizontal plane. FIG. 15B is a cross-sectional view of the power feeder F (the power receiver G) taken along a vertical plane.

As shown in FIGS. 15A and 15B, the power feeder F includes the primary coil 2, a primary magnetic core 8, a back plate 10, and a cover 11. The power receiver G includes the secondary coil 3, a secondary magnetic core 9, a back plate 10, and a cover 11. The surfaces of the primary coil 2 and the primary magnetic core 8, and the surfaces of the secondary coil 3 and the secondary magnetic core 9, are covered and fixed with a molded resin 12 containing a foam material 13. Specifically, a space between the back plate 10 and the cover 11 of the power feeder F (the power receiver G) is filled with the molded resin 12, and therefore, the surfaces of the primary coil 2 (the secondary coil 3) and the primary magnetic core 8 (the secondary magnetic core 9) provided therein are covered and fixed with the molded resin 12. The molded resin 12 is formed of, for example, silicone resin. The coverage and fixation allow the primary coil 2 (the secondary coil 3) to be positioned and fixed, and their mechanical intensity can be ensured, and at the same time, their heat can be dissipated. Specifically, the passage of an excitation current through the primary coil 2 (the secondary coil 3) releases Joule heat, which is then dissipated by heat conduction through the molded resin 12, and therefore, the primary coil 2 (the secondary coil 3) is cooled.

SUMMARY

When the contactless power transmission device is used for charging an electric propulsion vehicle etc., the power feeder and the power receiver are supposed to be installed outdoors. Therefore, foreign matter may be present between the power feeder and the power receiver of the contactless power transmission device. In particular, when a metal object which is an example of foreign matter enters a space between the power feeder and the power receiver and rides on the cover of the power feeder or the power receiver during power transmission, then if the metal object is left thereon, the metal object is overheated due to an eddy current caused by the magnetic flux. If the metal object present between the power feeder and the power receiver is overheated, so that the temperature of the metal object excessively increases, the power feeder or the power receiver is likely to be damaged, including failure etc. Also, if a conducting loop object (foreign matter) which can be linked with magnetic flux is inserted between the primary and secondary coils, electromotive force occurs at the opposite ends of the conducting object.

Therefore, in the contactless power transmission device, a sensor for detecting foreign matter which is present between the power feeder and the power receiver may be provided. For example, a temperature sensor for detecting overheating of foreign matter is used. Here, for example, if it is assumed that a capacitance sensor is used as the sensor for detecting foreign matter, the capacitance sensor may fail to exhibit a sufficient level of sensitivity in some structures of the contactless power transmission device (e.g., some structures of the power feeder or the power receiver).

The present disclosure describes implementations of a contactless power transmission device which can reliably detect the presence of foreign matter around the cover of the power feeder or the power receiver, particularly between the power feeder (primary coil) and the power receiver (secondary coil).

A contactless power transmission device according to a first embodiment of the present disclosure transmits power between a power feeder and a power receiver via electromagnetic induction. The power feeder includes a housing base member, a primary coil provided on the housing base member and configured to generate magnetic flux, a cover attached to the housing base member and configured to cover the primary coil, a capacitance sensor including a detection electrode between the primary coil and the cover, and configured to detect foreign matter around the cover based on a change in capacitance detected using the detection electrode, and a high-dielectric member embedded in the cover and having a permittivity higher than that of a material for the cover.

In the first embodiment, the power feeder includes the capacitance sensor including the detection electrode between the primary coil and the cover, and the high-dielectric member embedded in the cover and having a permittivity higher than that of the material for the cover. As a result, for example, a relative permittivity between foreign matter which is present on the cover and the detection electrode can be increased. As a result, the value of a capacitance which occurs when foreign matter is present on the cover can be increased. Therefore, the capacitance sensor can easily detect foreign matter. In other words, the capacitance sensor can reliably detect the presence of foreign matter.

A contactless power transmission device according to a second embodiment of the present disclosure transmits power between a power feeder and a power receiver via electromagnetic induction. The power receiver includes a housing base member, a secondary coil provided on the housing base member and configured to generate electromotive force depending on magnetic flux received from the power feeder, a cover attached to the housing base member and configured to cover the secondary coil, a capacitance sensor including a detection electrode between the secondary coil and the cover, and configured to detect foreign matter around the cover based on a change in capacitance detected using the detection electrode, and a high-dielectric member embedded in the cover and having a permittivity higher than that of the cover.

According to the second embodiment, the power receiver includes the capacitance sensor including the detection electrode between the secondary coil and the cover, and the high-dielectric member embedded in the cover and having a permittivity higher than that of the cover. As a result, for example, a relative permittivity between foreign matter which is present on the cover and the detection electrode can be increased. As a result, the value of a capacitance which occurs when foreign matter is present on the cover can be increased. Therefore, the capacitance sensor can easily detect foreign matter. In other words, the capacitance sensor can reliably detect the presence of foreign matter.

A power feeder according to a third embodiment of the present disclosure for feeding power to a power receiver of a contactless power transmission device via electromagnetic induction when the power feeder and the power receiver are positioned to face each other, includes a housing base member, a primary coil provided on the housing base member and configured to generate magnetic flux, a cover attached to the housing base member and configured to cover the primary coil, a capacitance sensor including a detection electrode between the primary coil and the cover, and configured to detect foreign matter around the cover based on a change in capacitance detected using the detection electrode, and a high-dielectric member embedded in the cover and having a permittivity higher than that of a material for the cover.

A power receiver according to a fourth embodiment of the present disclosure for receiving power from a power feeder of a contactless power transmission device, includes a housing base member, a secondary coil provided on the housing base member and configured to generate electromotive force depending on magnetic flux received from the power feeder, a cover attached to the housing base member and configured to cover the secondary coil, a capacitance sensor including a detection electrode between the secondary coil and the cover, and configured to detect foreign matter around the cover based on a change in capacitance detected using the detection electrode, and a high-dielectric member embedded in the cover and having a permittivity higher than that of the cover.

The present disclosure can provide a contactless power transmission device which can reliably detect the presence of foreign matter.

DETAILED DESCRIPTION

Embodiments will now be described in detail with reference to the accompanying drawings. The embodiments are in no way intended to limit the scope of the present disclosure.

Figure 1:
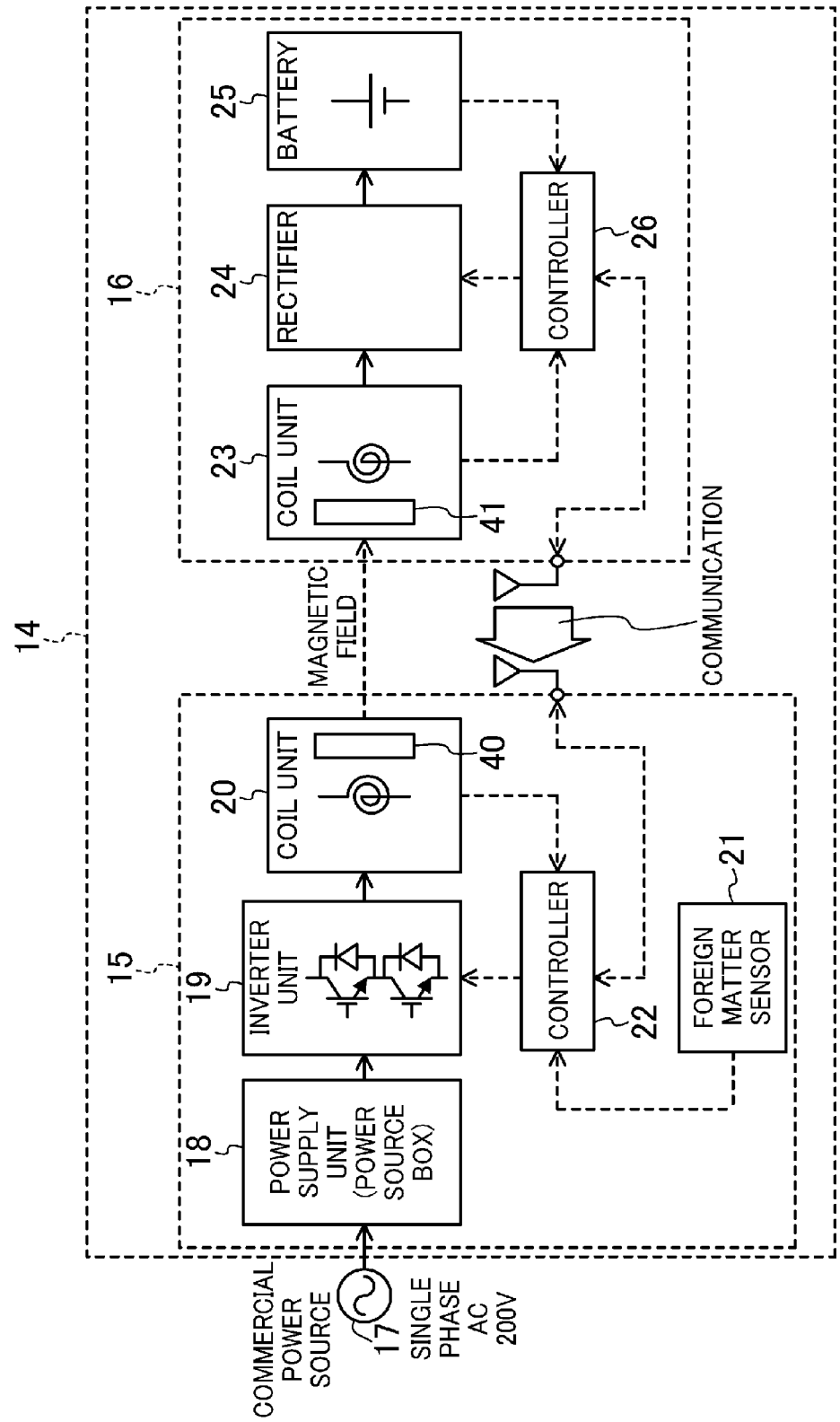
FIG. 1 is a block diagram showing an example configuration of a contactless power transmission device according to an embodiment.
Figure 2:
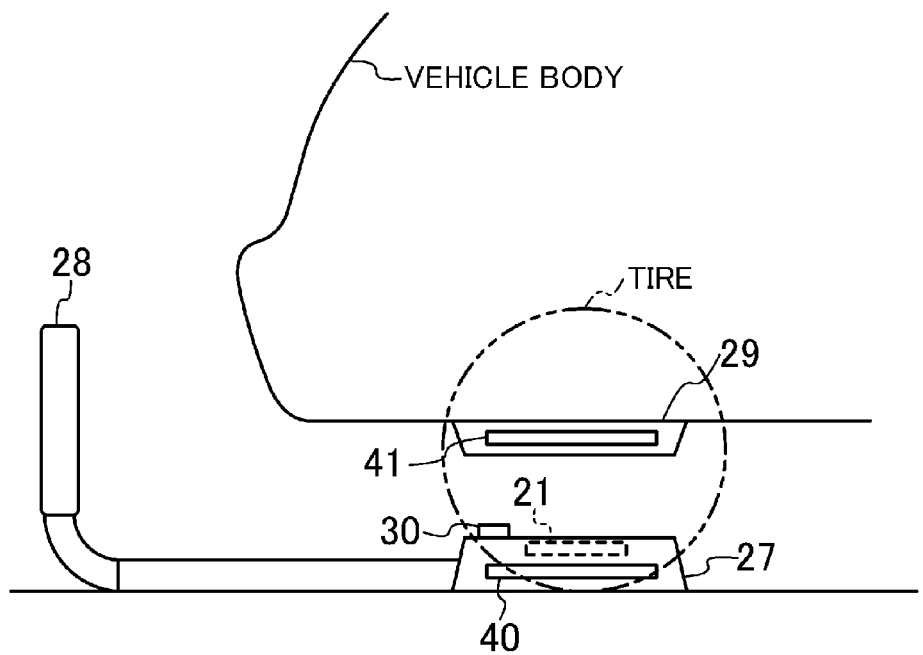
FIG. 2 is an external view showing how a power feeder of the contactless power transmission device of FIG. 1 is placed on the ground, how a receiver device is mounted in a vehicle, and how the vehicle is parked in a parking space.

FIG. 1 is a block diagram of a contactless power transmission device according to an embodiment of the present disclosure. FIG. 2 is an external view showing how a vehicle is parked in a parking space.

As shown in FIG. 1, the contactless power transmission device 14 includes, for example, a power feeder 15 which receives a voltage from a commercial power source 17 to generate a magnetic field, and a power receiver 16 which receives the magnetic field from the power feeder 15 to receive power.

The power feeder 15 includes a power source box 18 which is connected to the commercial power source 17 and serves as a power supply unit including a rectifier circuit, an inverter unit 19 which receives an output of the power source box 18, a power feed coil unit 20 (denoted as a coil unit in FIG. 1) including a primary coil 40 which receives an output of the inverter unit 19 to generate magnetic flux (magnetic field), a foreign matter detector 21 which includes a capacitance sensor and detects foreign matter, and a power feed controller (denoted as a controller in FIG. 1, e.g., a microcomputer) 22 which controls the power feeder 15. The commercial power source 17 is, for example, a low-frequency alternating-current power source of 200 V.

The power receiver 16 includes a power reception coil unit 23 (denoted as a coil unit in FIG. 1) including a secondary coil 41 which generates electromotive force depending on magnetic flux received from the power feed coil unit 20, a rectifier 24 which receives an output of the power reception coil unit 23, a battery 25 as a load which receives an output of the rectifier 24, and a power reception controller (denoted as a controller in FIG. 1, e.g., a microcomputer) 26 which controls the power receiver 16.

Note that the primary and secondary coils 40 and 41 may be either a plate coil or a solenoid coil. The primary and secondary coils 40 and 41 are preferably formed of a metal having a high conductivity, such as copper. Note that the primary and secondary coils 40 and 41 may be formed of another metal, such as aluminum etc.

As shown in FIG. 2, a primary coil housing 27 which accommodates the power feed coil unit 20 and the foreign matter detector 21 is placed on the ground, and a power source housing 28 which accommodates the power source box 18, the inverter unit 19, and the power feed controller 22 is provided in an upright position and is separated by a predetermined distance from the primary coil housing 27. On the other hand, a secondary coil housing 29 which accommodates the power reception coil unit 23 is attached to, for example, a bottom portion (e.g., a chassis) of a vehicle body.

When power is fed from the power feeder 15 to the power receiver 16, the user appropriately moves a vehicle so that the power feed coil unit 20 and the power reception coil unit 23 face each other. After the power feed coil unit 20 and the power reception coil unit 23 have been positioned to face each other, the power feed controller 22 drives and controls the inverter unit 19 to form a high-frequency electromagnetic field between the power feed coil unit 20 and the power reception coil unit 23. The power receiver 16 extracts power from the high-frequency electromagnetic field, and charges the battery 25 with the extracted power.

The power reception controller 26 determines a power command value based on the detected state of charge of the battery 25. The power feed controller 22 receives the power command value determined by the power reception controller 26, via wireless communication. The power feed controller 22 compares fed power detected from the power feed coil unit 20 with the power command value received from the power reception controller 26, and drives the inverter unit 19 so that the value of the fed power is equal to the power command value. The power reception controller 26 detects received power during power feed, and changes the power command value which is to be transmitted to the power feed controller 22 so that an overcurrent or an overvoltage is not applied to the battery 25.

The foreign matter detector 21 determines whether or not foreign matter is present around the cover. As used herein, the term "around the cover" refers to a region in which lines of magnetic force generated by the power feeder 15 during power transmission pass, such as a high-frequency electromagnetic field region and its vicinity, particularly a region in which the temperature of a metal increases due to the lines of magnetic force. In this embodiment, as shown in FIG. 2, the foreign matter detector 21 is provided inside the primary coil housing 27. Note that the place where the foreign matter detector 21 is provided is not limited to this. For example, the foreign matter detector 21 may be provided outside the power feed coil unit 20 or in the power receiver 16.

Specifically, for example, the foreign matter detector 21 may be provided inside the secondary coil housing 29.

Note that the term "foreign matter" as used herein refers to an object which may be present around the cover, particularly a metal piece etc. whose temperature may increase due to the electromagnetic field to cause damage to the contactless power transmission device etc.

Figure 3:
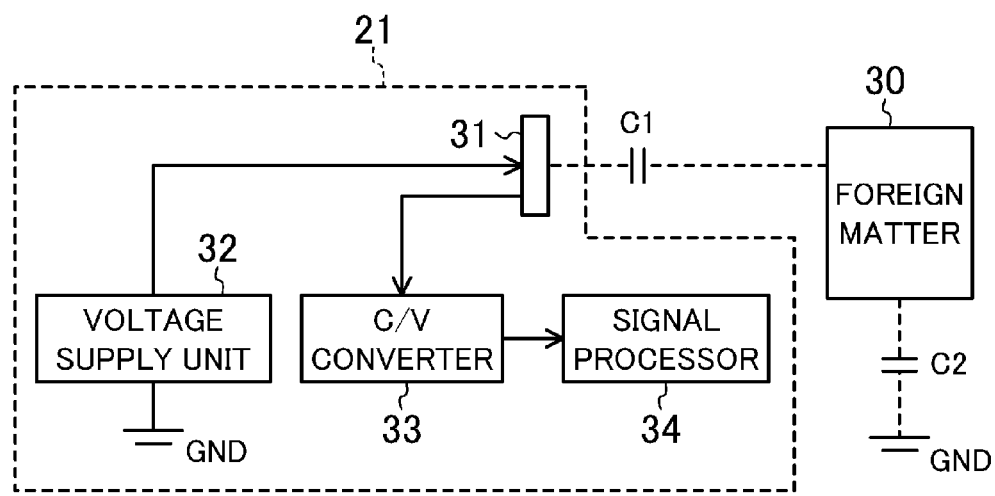
FIG. 3 is a block diagram showing an example configuration of a foreign matter detector.
Figure 4:
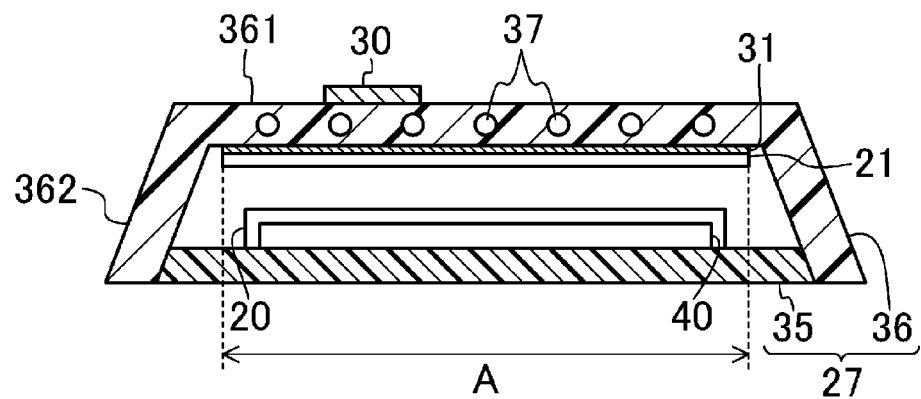
FIG. 4 is a partial cross-sectional view of the power feeder.
Figure 5:
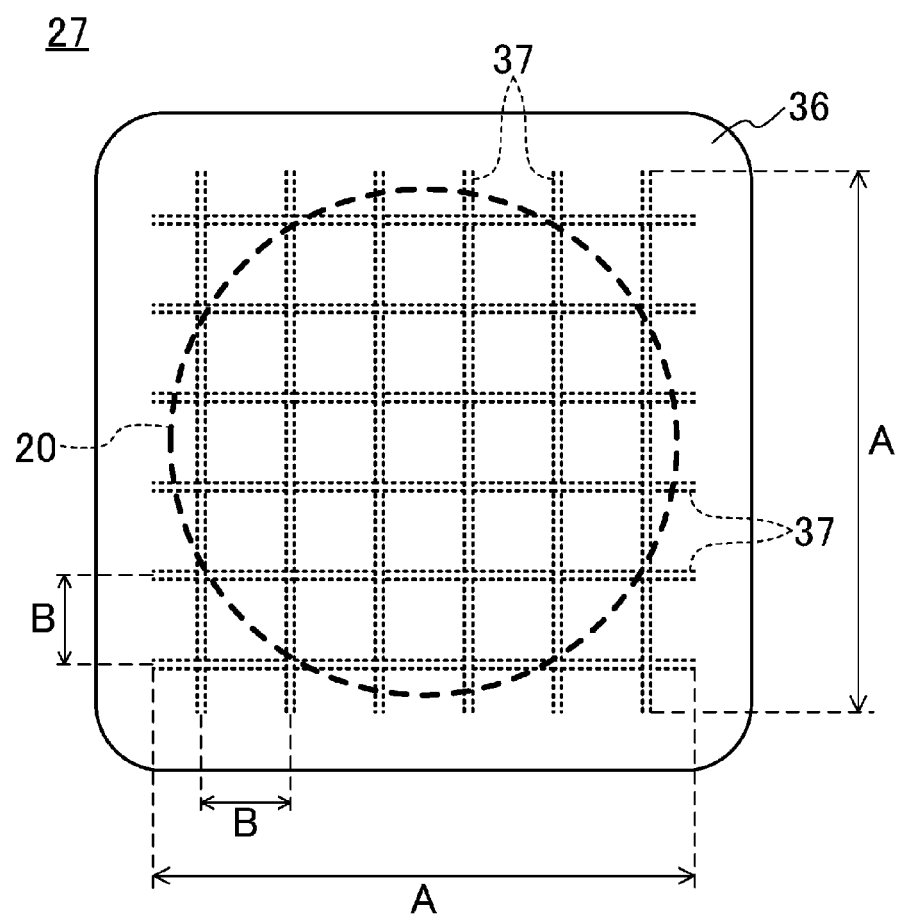
FIG. 5 is a plan view of a primary coil housing of the power feeder as viewed from the top.

FIG. 3 is a block diagram showing an example configuration of the foreign matter detector 21. FIG. 4 is a partial cross-sectional view of the power feeder 15. FIG. 5 is a plan view of the primary coil housing 27 of the power feeder 15 as viewed from the top.

As shown in FIG. 4, the primary coil housing 27 includes the power feed coil unit 20 including the primary coil 40 which is provided on a housing base plate 35 as a housing base member, a cover 36 which is attached to the housing base plate 35 and covers upper and side portions of the power feed coil unit 20, and the foreign matter detector 21 which is provided on a back surface of the cover 36.

The cover 36 includes an upper portion 361 which covers an upper portion of the power feed coil unit 20, and a side portion 362 which is integrally formed with the upper portion 361 and covers a side portion of the power feed coil unit 20. Thus, the cover 36 is attached to cover the upper and side portions of the power feed coil unit 20, whereby the power feed coil unit 20 can be protected.

The foreign matter detector 21 has an electrode 31 on a surface thereof facing the cover 36. The electrode 31 is in contact with a back surface (a surface facing the primary coil 40) of the upper portion 361 of the cover 36.

Note that, as shown in FIGS. 4 and 5, high-dielectric structures 37 are provided (embedded) over a range of the cover 36 which overlaps the corresponding electrode 31 in a direction (the vertical direction in FIG. 4 and the direction normal to the drawing paper in FIG. 5) of the magnetic flux generated by the primary coil 40. More specifically, the foreign matter detector 21 and the electrode 31 are arranged on the back surface of the upper portion 361 of the cover 36 in contact with each other in a range indicated by A×A. Therefore, the high-dielectric structures 37 are embedded in the range indicated by A×A of the upper portion 361 of the cover 36, which is a range overlapping the electrode 31, extending in the height direction (the vertical direction in FIG. 5) and the width direction (the horizontal direction in FIG. 5) of the cover 36, at a predetermined pitch B in each direction.

The high-dielectric structure 37 is formed of a material having a higher permittivity, such as glass fiber etc., instead of a resin material (e.g., unsaturated polyester, epoxy resin, etc.), which is a typical material for the cover 36. Note that the material for the high-dielectric structure 37 is not limited to glass fiber. Specifically, any material may be used that has a higher permittivity than that of a resin material, which is a typical material for the cover 36. Preferable examples of such a material include Bakelite (heat-resistant resin), styrene-butadiene rubber, ceramic, ballast, mica, water, etc.

As shown in FIG. 3, the foreign matter detector 21 includes the electrode 31, a voltage supply unit 32, a C/V converter 33, and a signal processor 34. The electrode 31 includes a voltage application electrode E1 and a detection electrode E2.

The voltage supply unit 32 is connected to the voltage application electrode E1, and applies a predetermined potential with reference to the ground (GND) potential to the voltage application electrode E1. When the voltage supply unit 32 applies the voltage to the voltage application electrode E1, then if foreign matter is present on the cover 36 as shown in FIG. 4, a capacitance C1 occurs between the detection electrode E2 and the foreign matter 30. The capacitance C1 is represented by:

$$C1 = \frac{\varepsilon 0 \times \varepsilon r \times S}{d} \quad (1)$$

where ∈0 represents the vacuum permittivity, ∈r represents the relative permittivity of the cover 36 (including the high-dielectric structures 37), S represents the minimum area where the detection electrode E2 and the foreign matter 30 overlap, and d represents the distance between the detection electrode E2 and the foreign matter 30.

Here, ∈r is the relative permittivity of the cover 36 including the high-dielectric structures 37. Therefore, ∈r has a value which satisfies the relationship ∈1<∈r<∈2 where ∈1 represents the relative permittivity of the cover 36 which is formed only of the resin material, and ∈2 represents the relative permittivity of the high-dielectric structure 37. Thus, the value of the capacitance C1 occurring when the same foreign matter 30 is present on the cover 36 is higher when the high-dielectric structure 37 is embedded in the cover 36 than when the high-dielectric structure 37 is not embedded in the cover 36. Therefore, the foreign matter 30 can be more easily detected by the foreign matter detector 21.

Note that the term "on the cover" as used herein with respect to foreign matter means that the foreign matter is present on or above an outer surface of the cover.

The C/V converter 33 converts the capacitance C1 into a voltage value. In this embodiment, the C/V converter 33 converts the capacitance C1+C2 into a corresponding voltage value, where C2 represents a capacitance between the foreign matter 30 and the GND potential.

The signal processor 34 transmits a signal corresponding to the voltage value obtained by the conversion performed by the C/V converter 33, i.e., a signal corresponding to the measured capacitance value, to the power feed controller 22.

In the above configuration, as the foreign matter 30 approaches the detection electrode E2, the distance d in Expression 1 decreases and the capacitance C1 increases. As a result, the measured capacitance value of the foreign matter detector 21 increases, and therefore, the presence of the foreign matter 30 can be detected. In other words, if the foreign matter detector 21 is appropriately positioned as described above, foreign matter which is present between the power feeder 15 and the power receiver 16 can be reliably detected. By providing the high-dielectric structure 37 in the cover 36, the voltage value obtained by the conversion performed by the C/V converter 33 increases, and therefore, foreign matter can be more reliably detected.

Figure 6A:
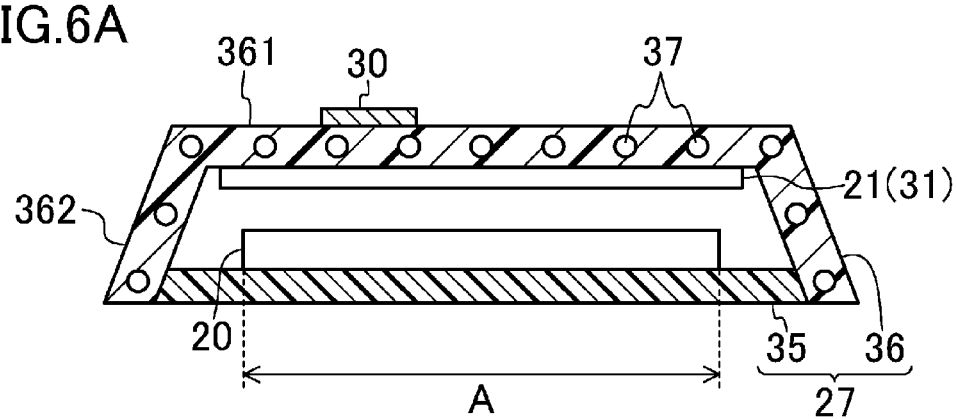
FIGS. 6A-6C are partial cross-sectional views showing other example configurations of the power feeder.
Figure 6B:
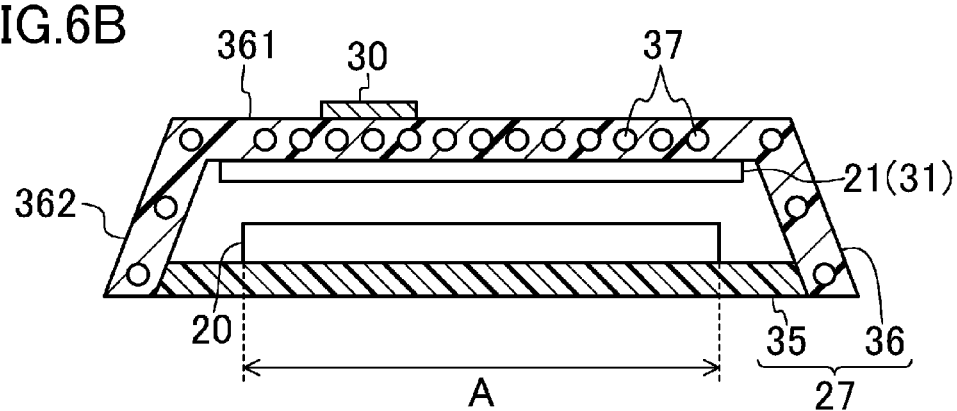

In the foregoing description, as shown in FIGS. 4 and 5, the high-dielectric structure 37 is provided in the upper portion 361 of the cover 36. The present disclosure is not limited to this. For example, as shown in FIGS. 6A-6C, the high-dielectric structure 37 may be embedded in both the upper portion 361 and the side portion 362 of the cover 36.

The density of the high-dielectric structures 37 embedded may be changed, depending on the amount of magnetic flux passing through the high-dielectric structures 37. For example, as shown in FIG. 6B, the density of the high-dielectric structures 37 may be higher in the upper portion 361 of the cover 36 through which a larger amount of magnetic flux passes than in the side portion 362. As a result, the relative permittivity of a portion of the cover 36 (including the high-dielectric structures 37) through which a larger amount of magnetic flux passes can be increased. In other words, the value of the capacitance C1 represented by Expression 1 in a portion through which a large amount of magnetic flux passes increases, and therefore, the foreign matter detector 21 can more easily detect the foreign matter 30. In other words, the foreign matter detector 21 can reliably detect the presence of the foreign matter 30. Note that a portion through which a larger amount of magnetic flux passes is more likely to cause overheating of the foreign matter 30, and therefore, if the foreign matter 30 can be more easily detected, safety can be improved.

Figure 6C:
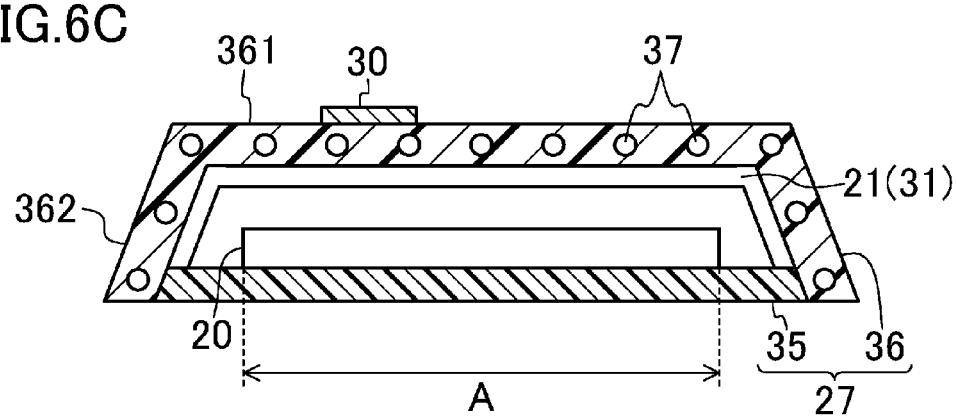

Also, as shown in FIG. 6C, the foreign matter detector 21 and the detection electrode E2 may be provided on back surfaces of the upper portion 361 and the side portion 362 of the cover 36. As a result, the presence of the foreign matter 30 can be reliably detected not only when it is located on or over the cover 36 but also when it is located lateral to the cover 36. In this case, if the high-dielectric structure 37 is embedded in both the upper portion 361 and the side portion 362 of the cover 36, the value of the capacitance C1 represented by Expression 1 increases not only when the foreign matter 30 is located on or over the cover 36 but also when the foreign matter 30 is located lateral to the cover 36, whereby the foreign matter detector 21 can more easily detect the foreign matter 30. In other words, the foreign matter detector 21 can reliably detect the presence of the foreign matter 30.

Figure 7A:
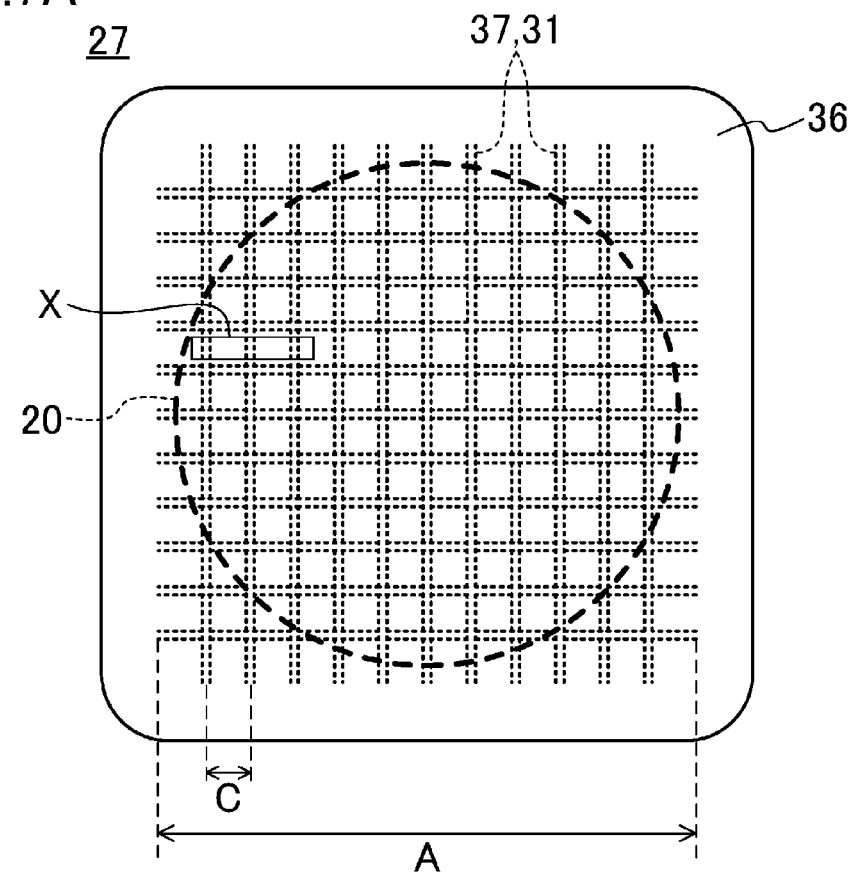
FIG. 7A is a plan view of the primary coil housing of the power feeder as viewed from the top.
Figure 7B:
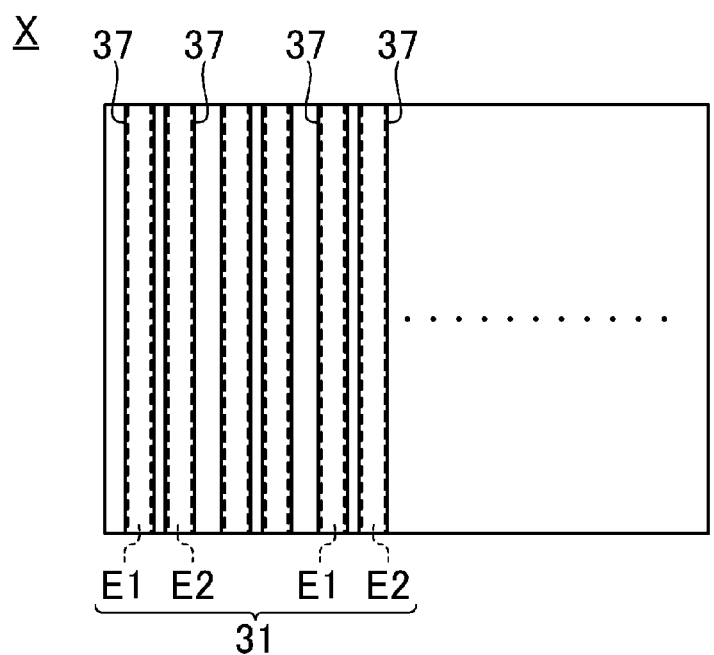
FIG. 7B is a diagram showing an example configuration of detection electrodes of the foreign matter detector and high-dielectric structures in a region X of FIG. 7A.

FIG. 7A is a plan view of the primary coil housing 27 of the power feeder 15 as viewed from the top. FIG. 7B shows an example configuration of the detection electrode E2 and the high-dielectric structure 37 of the foreign matter detector 21 in a region X of FIG. 7A. Note that, in FIG. 7A, the high-dielectric structures 37 have a narrow pitch (the pitch width is denoted by C in FIG. 7A) compared to FIG. 5. Thus, the pitch width may be narrowed.

As shown in FIG. 7B, the voltage application electrodes E1 and the detection electrodes E2 are alternately arranged side by side at a predetermined pitch in the width direction (the horizontal direction of FIG. 7B) of the cover 36. The high-dielectric structures 37 are provided, corresponding to the voltage application electrode E1 and the detection electrode E2. More specifically, for example, the high-dielectric structures 37 are located in a range which overlaps the voltage application electrode E1 and the detection electrode E2 in the direction (the direction normal to the drawing paper in FIG. 7B) of the magnetic flux generated from the primary coil 40.

Figure 8A:
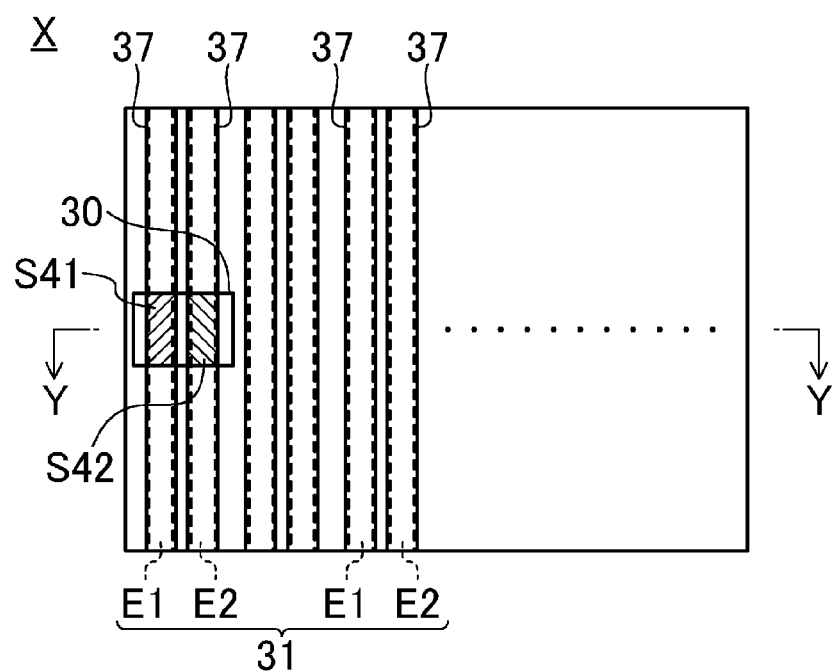
FIGS. 8A and 8B are diagrams for describing a capacitance which occurs when foreign matter is present on a cover of the primary coil housing of FIGS. 7A and 7B.
Figure 8B:
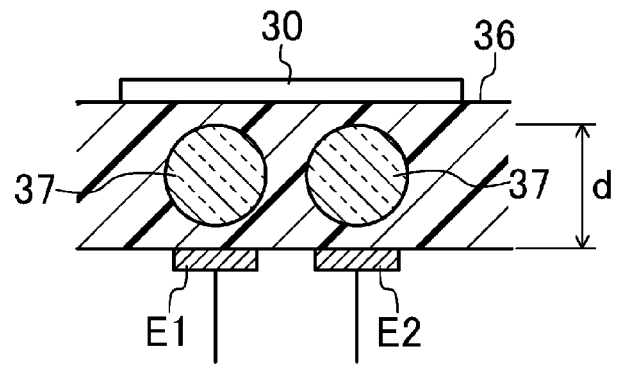

FIGS. 8A and 8B are diagrams for describing the capacitance C1 which occurs when the foreign matter 30 is present on the cover 36 of the primary coil housing 27 of FIGS. 7A and 7B. FIG. 8A is an enlarged view of the region X of FIG. 7A. FIG. 8B is a cross-sectional view taken along line Y-Y of FIG. 8A. Here, the minimum area where the voltage application electrode E1 faces the foreign matter 30 is indicated by a reference character S41, and the minimum area where the detection electrode E2 faces the foreign matter 30 is indicated by a reference character S42. In FIG. 8B, it is also assumed that the high-dielectric structure 37 has a circular cross-section. Note that the cross-section of the high-dielectric structure 37 may have a quadrangular shape or other shapes.

As shown in FIG. 8B, the high-dielectric structures 37 are provided in a range which overlaps the voltage application electrode E1 and the detection electrode E2 in the direction of the magnetic flux. As a result, the relative permittivity of the cover 36 (including the high-dielectric structure 37) between the foreign matter 30 and the detection electrode E2 which occurs when the foreign matter 30 is present on the cover 36, can be increased. As a result, the capacitance C1 which occurs when the foreign matter 30 is present on the cover 36 can be increased. Therefore, the foreign matter detector 21 can more easily detect the foreign matter 30. In other words, the foreign matter detector 21 can reliably detect the presence of the foreign matter 30.

Note that the arrangement in which the high-dielectric structures 37 face the voltage application electrode E1 and the detection electrode E2 is not limited to that of FIG. 8B. For example, in FIG. 8B, the voltage application electrode E1 and the detection electrode E2, and the high-dielectric structures 37, do not necessarily need to have the same size or coincide with each other (e.g., the locations of the detection electrode E2 and the high-dielectric structure 37 do not coincide with each other in the horizontal direction of FIG. 8B). For example, the diameter of the cross-section of the high-dielectric structure 37 may be smaller than the widths (lengths in the horizontal direction of FIG. 8B) of the voltage application electrode E1 and the detection electrode E2.

In FIG. 8B, a plurality of the high-dielectric structures 37 whose cross-sections have a small diameter compared to FIG. 8B may be arranged side by side in the horizontal and vertical directions of FIG. 8B below each of the voltage application electrodes E1 and the detection electrodes E2. Thus, a plurality of the high-dielectric structures 37 may be provided, corresponding to each of the voltage application electrodes E1 and the detection electrodes E2.

Figure 9A:
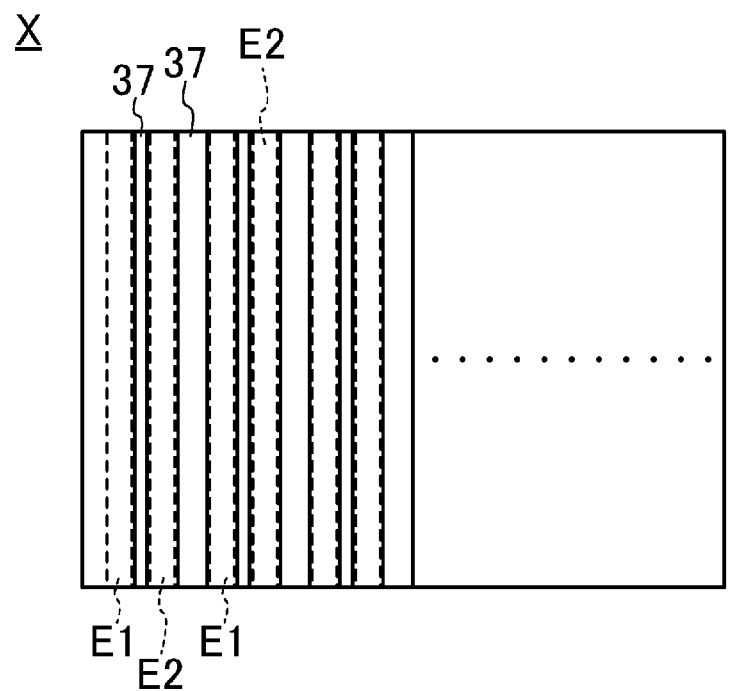
FIGS. 9A and 9B are diagrams showing other example arrangements of the high-dielectric structures and the electrodes of the foreign matter detector.
Figure 9B:
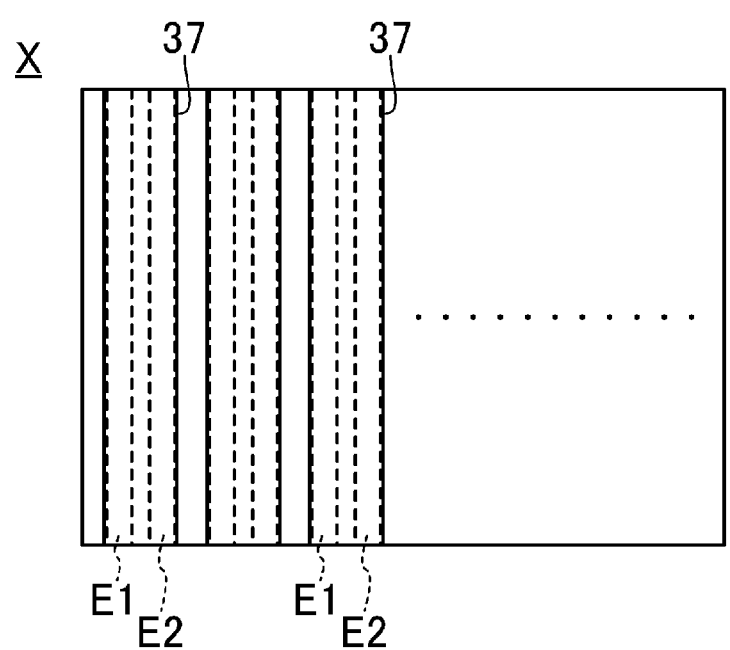

FIGS. 9A and 9B are enlarged views showing other example arrangements of the high-dielectric structures 37 and the voltage application electrodes E1 and the detection electrodes E2, in the region X of FIG. 7A.

In FIG. 9A, the high-dielectric structure 37 is provided between the voltage application electrode E1 and the detection electrode E2 in the direction of the magnetic flux. By such an arrangement, a capacitance which occurs when foreign matter is present between the adjacent detection electrodes E2 is easily detected. In other words, the foreign matter detector 21 can reliably detects the presence of the foreign matter 30.

In FIG. 9B, a region which includes the adjacent voltage application electrode E1 and detection electrode E2, and the high-dielectric structure 37, may overlap each other in the direction of the magnetic flux. Thus, the high-dielectric structure 37 is provided over a range including two or more electrodes.

Note that, in FIG. 9A, similar to FIG. 8, a plurality of the high-dielectric structures 37 may each be provided, corresponding to a location between the voltage application electrode E1 and the detection electrode E2. Similarly, in FIG. 9B, a plurality of the high-dielectric structures 37 may each be provided, corresponding to a region including the voltage application electrode E1 and the detection electrode E2.

Figure 10:
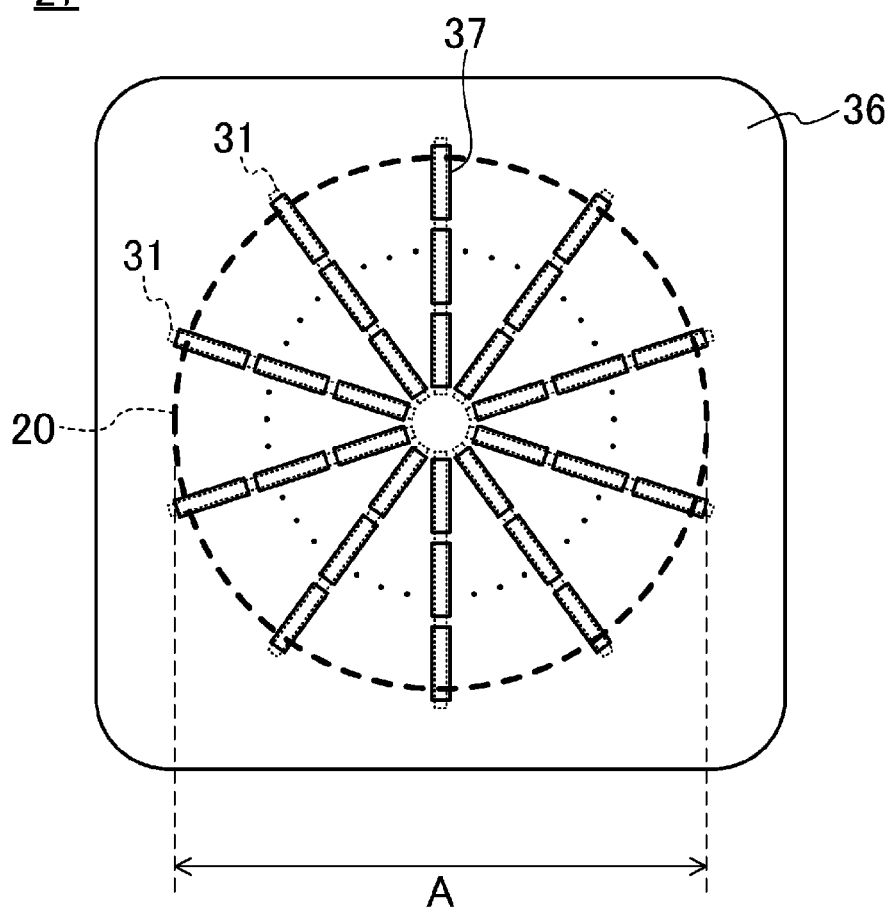
FIG. 10 is a plan view another example arrangement of the electrodes of the foreign matter detector and the high-dielectric structures.

FIG. 10 is a plan view of the primary coil housing 27 of the power feeder 15 as viewed from the top, showing another example arrangement of the high-dielectric structure 37 and the electrode 31.

As shown in FIG. 10, the high-dielectric structures 37 are radially arranged along a surface of the cover 36, extending outward from a center of the primary coil housing 27, as viewed from the top. The electrodes 31 are provided, corresponding to the high-dielectric structures 37. More specifically, the electrodes 31 are arranged along the directions in which the high-dielectric structures 37 extend, in ranges which overlap the high-dielectric structures 37 in the direction (the direction normal to the drawing paper in FIG. 10) of the magnetic flux. As a result, the value of the capacitance C1 which occurs when the foreign matter 30 is present on the cover 36 can be increased. Therefore, the foreign matter detector 21 can more easily detect the foreign matter 30. In other words, the foreign matter detector 21 can reliably detects the presence of the foreign matter 30. Note that, in the above example, the electrodes 31 are provided, corresponding to locations where the high-dielectric structures 37 are provided. Alternatively, the high-dielectric structures 37 are provided, corresponding to locations where the electrodes 31 are provided.

[Operation of Charging Battery by Contactless Power Transmission]

Next, a contactless power transmission control according to this embodiment will be described with reference to flowcharts shown in FIGS. 11 and 12. Here, it is assumed that, as shown in FIG. 2, the power feeder 15 is placed on the ground, and the power receiver 16 is mounted in a vehicle.

Figure 11:
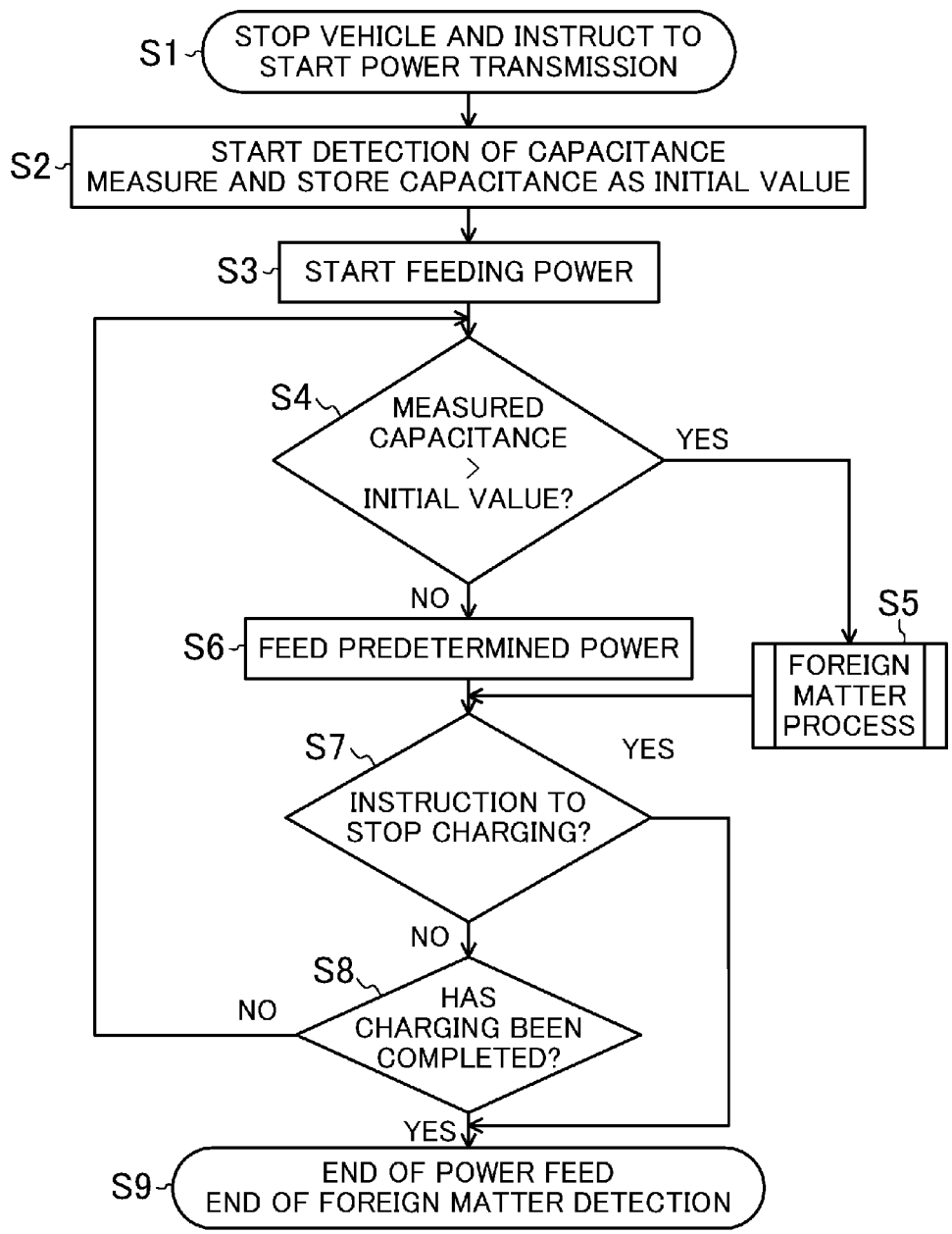
FIG. 11 is a flowchart showing an example of a contactless power transmission control according to this embodiment.

Initially, in step S1 of FIG. 11, a vehicle including the power receiver 16 is parked so that the power feed coil unit 20 and the power reception coil unit 23 are positioned to face each other, and thereafter, the power feed controller 22 receives an instruction to start power transmission and a power command value from the power reception controller 26 via wireless communication (step S1). Although, in step S1, the power feed controller 22 receives the power transmission start instruction from the power reception controller 26, the present disclosure is not limited to this. For example, the power feed controller 22 may receive the power transmission start instruction from the user.

After the reception of the power command value, in step S2 the foreign matter detector 21 starts the capacitance measurement operation to output a measured capacitance value to the power feed controller 22. The power feed controller 22 stores the capacitance value received from the foreign matter detector 21 as an initial value. A portion of the foreign matter detector 21 which measures the capacitance includes the detection electrode E2, and measures the capacitance in, for example, an electromagnetic field region on the cover 36 covering the power feed coil unit 20 as a detection region. Note that the power feed controller 22 may use a predetermined value previously stored therein, as the initial value, instead of the capacitance value received from the foreign matter detector 21.

Next, the power feed controller 22 instructs the inverter unit 19 to start power transmission, and thereby starts feeding power from the power feed coil unit 20 to the power reception coil unit 23 (step S3).

Next, the power feed controller 22 compares a measurement value of the capacitance (measured capacitance) obtained by the detection electrode E2 of the foreign matter detector 21 with the initial value to determine whether or not there is a change in the capacitance due to the presence of foreign matter (step S4). Note that the power feed controller 22 may use, as the initial value, for example, a "value obtained by adding a predetermined value which is determined based on a variation factor such as a change in measurement accuracy etc., to the initial value received from the power reception controller 26." As a result, a variation factor involved in determining the presence of foreign matter can be reduced or eliminated.

If the value of the capacitance measured in step S4 exceeds the initial value ("YES" in step S4), the power feed controller 22 determines that foreign matter is present, and control proceeds to a foreign matter process in which transmission power is controlled (step S5). As a result, extensive damage due to overheating of foreign matter can be reduced or prevented.

On the other hand, if the value of the capacitance measured in step S4 is not more than the initial value ("NO" in step S4), the power feed controller 22 determines that foreign matter is not present, and causes the inverter unit 19 to continue power transmission (step S6).

Figure 12:
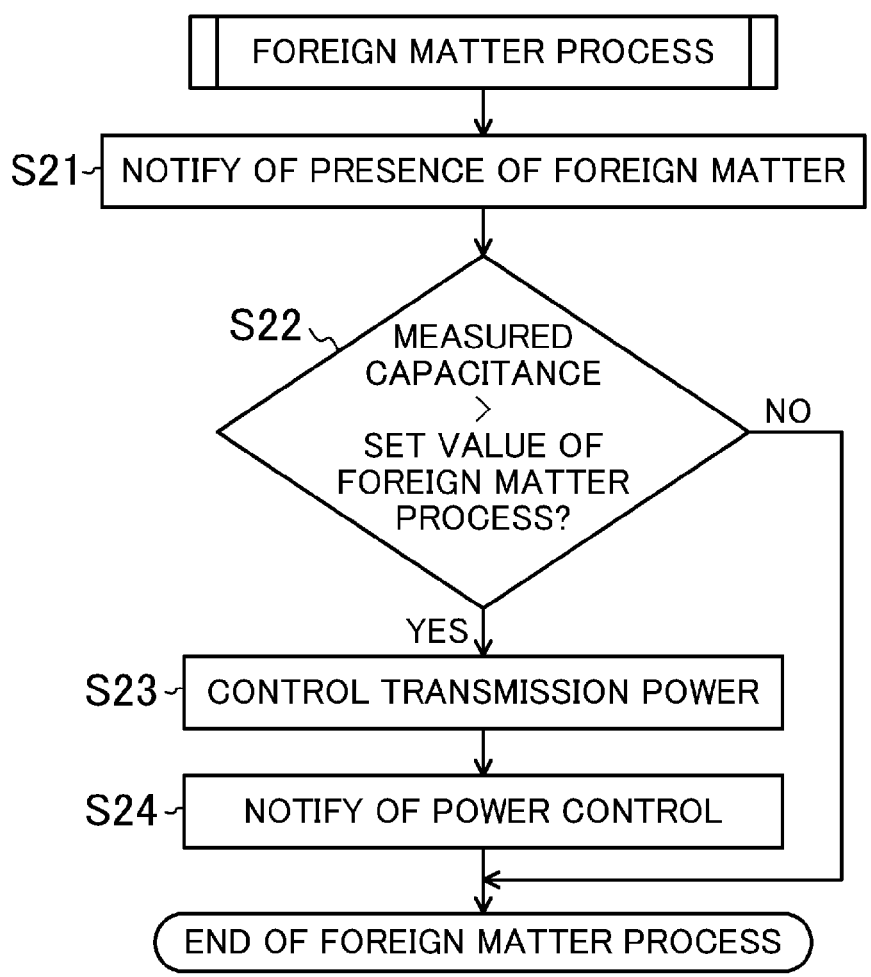
FIG. 12 is a flowchart showing an example of a foreign matter process.

FIG. 12 is a flowchart showing an example of the foreign matter process (step S5 of FIG. 11). When control proceeds to the foreign matter process, the power feeder 15 initially notifies the user of the presence of foreign matter detected by the foreign matter detector 21 by notification means, such as display, sound, etc. For example, a loudspeaker is provided in the power source housing 28 of FIG. 2 and is used for the notification (step S21).

Next, the power feed controller 22 compares the measured capacitance with the set value of the foreign matter process to perform a detailed determination, such as reduction or elimination of an aging factor, the degree of danger, etc. (step S22).

As used herein, the term "aging factor" refers to a cause for a change in capacitance due to a change in environment during measurement, such as an increase in temperature of a device, a change in weather, etc.

The "set value of the foreign matter process" may be, for example, a value which is obtained by adding to the initial value a predetermined value which is determined based on the aging factor, or a limit value for reducing or preventing danger which is determined based on a capacitance value which would occur in the presence of foreign matter and is obtained based on design data.

If it is determined in step S22 that the measured capacitance value exceeds the set value of the foreign matter process ("YES" in step S22), the power feed controller 22 suppresses the transmission power, e.g., reduces the transmission power from the power feed coil unit 20 to the power reception coil unit 23 by a predetermined amount (e.g., by a half), or stops power transmission, etc. (step S23). Moreover, the power feed controller 22 notifies the user that transmission power is controlled in the presence of foreign matter, by notification means, such as display, sound, etc. (step S24), and the foreign matter process is ended, and control proceeds to step S7.

On the other hand, if it is determined in step S22 that the measured capacitance does not exceed the set value ("NO" in step S22), the power feed controller 22 ends the foreign matter process without performing steps S23 and S24, and control proceeds to step S7.

In step S7 of FIG. 11, it is determined whether or not there is an instruction to interrupt power transmission because the user removes foreign matter or uses the vehicle, etc. If the determination result is positive ("YES" in step S7), the power feed controller 22 instructs the inverter unit 19 to end power transmission, and therefore, the power feed from the power feed coil unit 20 to the power reception coil unit 23 is stopped, and the foreign matter detector 21 ends the capacitance measurement operation (step S9).

If, in step S7, there is not an instruction to interrupt power transmission ("NO" in step S7), control proceeds to step S8. In step S8, the power feed controller 22 determines whether or not charging has been completed. If the determination result is negative ("NO" in step S8), control returns to step S4, and otherwise ("YES" in step S8), the power feed controller 22 ends the power feed, and the foreign matter detector 21 ends the foreign matter detection operation (step S9).

[Other Example Configurations of Power Feeder]

Figure 13A:
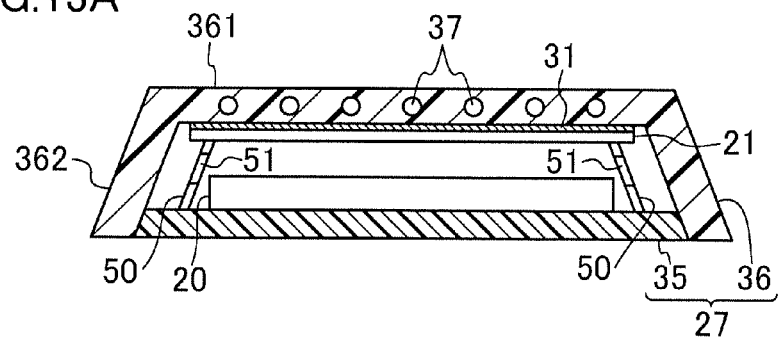
FIGS. 13A and 13B are partial cross-sectional views showing another example configuration of the power feeder.

FIG. 13A is a partial cross-sectional view showing another example configuration of the power feeder 15. In FIG. 13A, the power feeder 15 includes, in addition to the configuration of FIG. 4, a support member 50 which has one end fixed to the housing base plate 35 and the other end supporting a lower surface of the foreign matter detector 21 (the electrode 31).

Figure 13B:
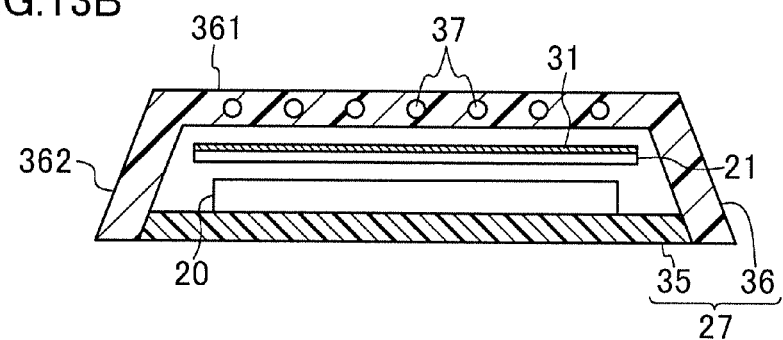
Figure 14:
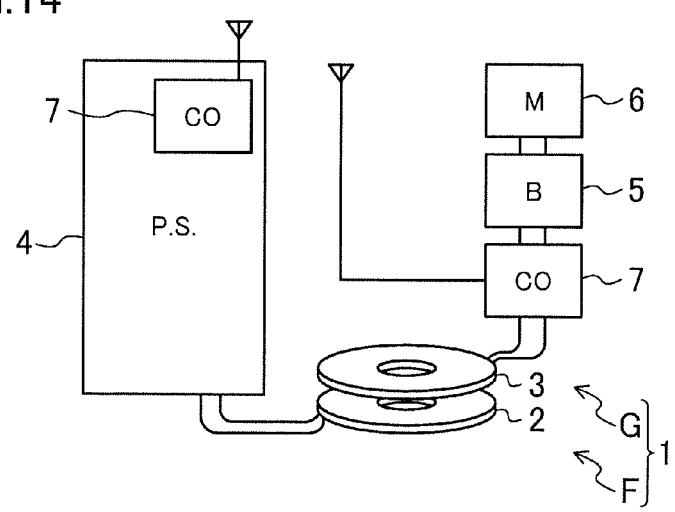
FIG. 14 is a diagram showing a configuration of a conventional contactless power transmission device.
Figure 15A:
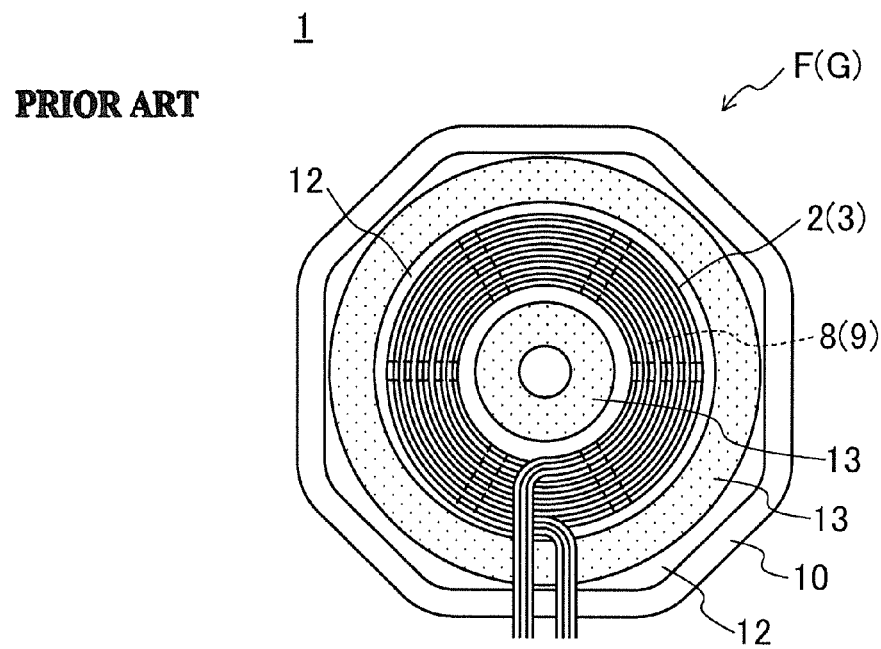
FIG. 15A is a cross-sectional view of the power feeder of FIG. 14 taken along a horizontal plane.
Figure 15B:
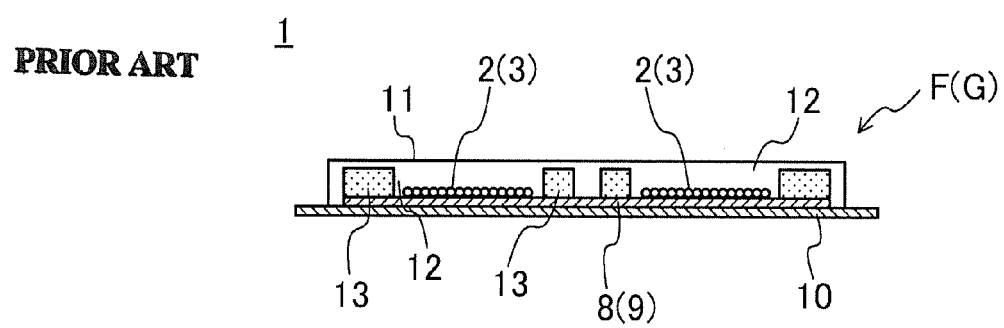
FIG. 15B is a cross-sectional view of the power feeder of FIG. 14 taken along a vertical plane.

As shown in FIG. 13A, by providing the support member 50 in the power feeder 15, the foreign matter detector 21 can be supported so that a back surface (a surface facing the primary coil 40) of the upper portion 361 of the cover 36 is in contact with a front surface of the electrode 31. As a result, for example, compared to when, as shown in FIG. 13B, the electrode 31 is located away from the back surface of the upper portion 361, the electrode 31 can be located closer to foreign matter on the cover 36. In other words, by providing the support member 50 in the power feeder 15, foreign matter which is present around the cover can be reliably detected. More specifically, the configuration of FIG. 13B is different from that of FIG. 13A in that, when foreign matter is present on the cover 36, a capacitance of a gap portion (distance: d1) between the upper portion 361 of the cover 36 and the foreign matter detector 21 is added to the capacitance calculated by Expression 1. As a result, in the configuration of FIG. 13B, the value of the calculated capacitance is small compared to the configuration of FIG. 13A.

Thus, by providing the support member 50 to the power feeder 15, the front surface of the electrode 31 is in contact with the back surface of the upper portion 361 of the cover 36, and therefore, the relative permittivity between the foreign matter 30 and the detection electrode E2 which occurs when the foreign matter 30 is present on the cover 36 can be increased. Therefore, the value of the capacitance which occurs when the same foreign matter 30 is present on the cover 36 is larger when the support member 50 is provided than when the support member 50 is not provided. In other words, the foreign matter detector 21 can more easily detect the foreign matter 30.

Note that, in FIG. 13A, a position adjustment portion 51 may be provided so that, when a pressure load is applied to the support member 50 from the top of the cover 36 and then is removed, the detection electrode E2 comes into contact with the back surface of the upper portion 361 of the cover 36 again. As a result, even when a pressure load is applied from the top of the cover 36 and then is removed, the detection electrode E2 comes into contact with the back surface of the upper portion 361 at the original position thereof. As a result, even when a pressure load is applied from the top of the cover 36, then if the pressure load is subsequently removed, foreign matter which is present around the cover can be reliably detected.

In the above embodiment, the foreign matter detector 21 is provided in the power feeder 15 as an example. The present disclosure is not limited to this. For example, the foreign matter detector 21 may be provided in the power receiver 16. Alternatively, the foreign matter detector may be provided in each of the power feeder 15 and the power receiver 16.

In the above embodiment, the high-dielectric structure 37 is located at substantially the center in the thickness direction of the cover 36. Alternatively, all or a portion of the high-dielectric structure 37 may be exposed on an outer surface of the cover 36.

The present disclosure provides a contactless power transmission device which can reliably detect the presence of foreign matter. Therefore, for example, the present disclosure is useful for a contactless power transmission device which charges, or extracts charged power from, an in-vehicle battery of an electric vehicle.

What is claimed is:

1. A contactless power transmission device for transmitting power between a power feeder and a power receiver via electromagnetic induction, wherein
the power feeder includes:
a housing base member,
a primary coil provided on the housing base member and configured to generate magnetic flux,
a cover attached to the housing base member and configured to cover the primary coil,
a capacitance sensor including a detection electrode between the primary coil and the cover, and configured to detect foreign matter around the cover based on a change in capacitance detected using the detection electrode,
a high-dielectric member embedded in the cover and having a permittivity higher than that of a material for the cover, and
wherein the cover has an upper portion configured to cover an upper portion of the primary coil and a side portion configured to cover a side portion of the primary coil,
the detection electrode is provided between the upper portion of the cover and the primary coil and between the side portion of the cover and the primary coil, and
the high-dielectric member is embedded in the upper and side portions of the cover.

2. The contactless power transmission device of claim 1, wherein the high-dielectric member is provided in a range overlapping the corresponding detection electrode in a direction of the magnetic flux.

3. The contactless power transmission device of claim 1, wherein
there are a plurality of the detection electrodes arranged at a predetermined pitch, and
the high-dielectric member is arranged to correspond to each of the detection electrodes.

4. The contactless power transmission device of claim 1, wherein
the high-dielectric member is radially arranged along a surface of the cover, extending outward from a center of the cover, and
the detection electrode is arranged to correspond to the high-dielectric member.

5. The contactless power transmission device of claim 1, wherein the high-dielectric member embedded in the cover has a higher density at a location where the amount of passing magnetic flux is large than at a location where the amount of passing magnetic flux is small.

6. The contactless power transmission device of claim 1, wherein a front surface of the detection electrode is in contact with a back surface of the cover.

7. The contactless power transmission device of claim 6, further comprising:
a support member configured to support the detection electrode so that the detection electrode is in contact with the back surface of the cover.

8. The contactless power transmission device of claim 7, wherein the support member includes a position adjustment portion configured to, when a pressure load is externally applied to the cover and then is removed, adjust the detection electrode so that the detection electrode comes into contact with the back surface of the cover at an original position thereof.

9. A contactless power transmission device for transmitting power between a power feeder and a power receiver via electromagnetic induction, wherein
the power receiver includes:
a housing base member,
a secondary coil provided on the housing base member and configured to generate electromotive force depending on magnetic flux received from the power feeder,
a cover attached to the housing base member and configured to cover the secondary coil,
a capacitance sensor including a detection electrode between the secondary coil and the cover, and configured to detect foreign matter around the cover based on a change in capacitance detected using the detection electrode, and
a high-dielectric member embedded in the cover and having a permittivity higher than that of the cover, and
wherein the cover has an upper portion configured to cover an upper portion of the primary coil and a side portion configured to cover a side portion of the primary coil,
the detection electrode is provided between the upper portion of the cover and the primary coil and between the side portion of the cover and the primary coil, and
the high-dielectric member is embedded in the upper and side portions of the cover.

10. A power feeder for feeding power to a power receiver of a contactless power transmission device via electromagnetic induction when the power feeder and the power receiver are positioned to face each other, the power feeder comprising:
a housing base member;
a primary coil provided on the housing base member and configured to generate magnetic flux;
a cover attached to the housing base member and configured to cover the primary coil;
a capacitance sensor including a detection electrode between the primary coil and the cover, and configured to detect foreign matter around the cover based on a change in capacitance detected using the detection electrode; and
a high-dielectric member embedded in the cover and having a permittivity higher than that of a material for the cover,
wherein the cover has an upper portion configured to cover an upper portion of the primary coil and a side portion configured to cover a side portion of the primary coil,
the detection electrode is provided between the upper portion of the cover and the primary coil and between the side portion of the cover and the primary coil, and
the high-dielectric member is embedded in the upper and side portions of the cover.

11. A power receiver for receiving power from a power feeder of a contactless power transmission device, the power receiver comprising:
a housing base member;
a secondary coil provided on the housing base member and configured to generate electromotive force depending on magnetic flux received from the power feeder;
a cover attached to the housing base member and configured to cover the secondary coil;

a capacitance sensor including a detection electrode between the secondary coil and the cover, and configured to detect foreign matter around the cover based on a change in capacitance detected using the detection electrode; and
a high-dielectric member embedded in the cover and having a permittivity higher than that of the cover,
wherein the cover has an upper portion configured to cover an upper portion of the primary coil and a side portion configured to cover a side portion of the primary coil,
the detection electrode is provided between the upper portion of the cover and the primary coil and between the side portion of the cover and the primary coil, and
the high-dielectric member is embedded in the upper and side portions of the cover.

* * * * *